United States Patent
Takagi et al.

(10) Patent No.: US 6,787,488 B2
(45) Date of Patent: Sep. 7, 2004

(54) ELECTRICALLY CONDUCTIVE FABRIC

(75) Inventors: Susumu Takagi, Fukui (JP); Shigekazu Orita, Fukui (JP)

(73) Assignee: Seiren Co., Ltd., Fukui (JP)

( * ) Notice: Subject to any disclaimer, the term of this patent is extended or adjusted under 35 U.S.C. 154(b) by 88 days.

(21) Appl. No.: 09/818,289

(22) Filed: Mar. 27, 2001

(65) Prior Publication Data

US 2001/0036785 A1 Nov. 1, 2001

(30) Foreign Application Priority Data

Mar. 29, 2000 (JP) ........................................ 2000-095192

(51) Int. Cl.[7] .......................... B32B 27/12; D03D 13/00
(52) U.S. Cl. ........................ 442/110; 442/203; 442/208; 442/218; 442/220; 442/229; 442/231; 428/364; 428/365; 428/370

(58) Field of Search ............................... 428/364, 365, 428/370; 442/59, 110, 181, 203, 208, 218, 220, 228, 229, 231

(56) References Cited

U.S. PATENT DOCUMENTS

| 4,816,124 | A | * | 3/1989 | Manabe et al. | .......... 204/192.1 |
| 5,981,409 | A | * | 11/1999 | Takagi et al. | ............ 139/420 A |

* cited by examiner

Primary Examiner—Ula C. Ruddock
(74) Attorney, Agent, or Firm—Dilworth & Barrese, LLP.

(57) ABSTRACT

An electrically conductive fabric plated with a metal is disclosed wherein a percent fabric surface occupancy of warp as a constituent of the fabric is 90% to 110% and that of weft is 40% to 80%. The electrically conductive fabric is superior in all of resin back leak preventing property, flexibility yarn fray preventing property, electrical conductivity and electromagnetic wave shieldability.

25 Claims, 1 Drawing Sheet

ELECTRICALLY CONDUCTIVE FABRIC

FIELD OF THE INVENTION

The present invention relates to an electrically conductive fabric and more particularly to an electrically conductive fabric superior in all of back leak preventing property of resin, flexibility, yarn fray preventing property, electrical resistivity, and electromagnetic wave shielding property.

BACKGROUND OF THE INVENTION

It is known to form a metal coating on a fabric, thereby making the fabric electrically conductive, and use the thus-coated fabric as an electromagnetic wave shielding material or a grounding material.

In such an application, the electrically conductive fabric is also required to be flexible because it is often used in an attached state to a housing of an electronic device.

When the electrically conductive fabric is to be used in such a use, it is in many cases cut into a predetermined small size or into fine strips, so there arises the problem that the constituent yarns of the fabric are frayed.

To prevent such a fray of the constituent yarns of the electrically conductive fabric, a resin such as an acrylic resin is imparted to the fabric.

Moreover, when the electrically conductive fabric is to be applied to such a use as mentioned above, the fabric is often required to exhibit flame retardancy and this requirement is increasing. To meet this requirement, a flame-retardant is added to the electrically conductive fabric.

Further, when the electrically conductive fabric is to be used in an attached state to a housing of an electronic device, a pressure-sensitive adhesive or a hot melt adhesive is often applied to the fabric.

In this case, it is required to prevent back leak of the applied resin so as not to deteriorate the quality of the electrically conductive fabric. To meet this requirement, that is, to prevent back leak of the resin, there are performed such weaving and processing as increase the yarn density of the fabric, thereby minimizing pores between the fibers which constitute the fabric.

It is known that the fabric thus increased in its yarn density and having a metallic coating thereon is improved in shielding property.

Generally, however, if the yarn density of a fabric is increased, the fabric tends to become less flexible. If the fabric is plated, it becomes harder. For example, therefore, if the electrically conductive fabric in question is wound round a urethane foam to afford a foam gasket and the foam gasket is used as a substrate grounding material, it is inferior in point of adhesion to a housing of an electronic device and is not desirable as an electromagnetic wave shielding material.

In an effort to avoid such an inconvenience, ultrafine yarns or finished yarns have heretofore been used to improve the flexibility of the resulting fabric.

A plain weave fabric, which is relatively difficult to fray, is also used for diminishing the fray of yarn.

However, in the case where a fabric is produced using the yarns composed of ultrafine filaments or the finished yarns and is then plated, even if the fabric is flexible before the plating, a multifilament yarn which constitutes the fabric is restrained and becomes like a monofilament, so that the fabric becomes less flexible.

Moreover, by merely increasing the density of a fabric, it is difficult to completely minimizing pores formed at warp-weft intersecting points of the fabric and the remaining fiber-to-fiber pores make it difficult to improve the electromagnetic wave shielding property and electrical conductivity. Also, there remains the problem of back leak of resin when the resin is applied in a post-processing.

Further, using an ultrafine yarn or a finished yarn and increasing the yarn density of a fabric results in an increase of cost and of the material surface area, with consequent increase in the amount of metal used in plating and likelihood of an increase of the plating cost.

OBJECT OF THE INVENTION

It is an object of the present invention to solve the above-mentioned problems of the prior art and provide particularly a fabric capable of preventing the back leak of resin while ensuring flexibility and possessing high electrical conductivity and electromagnetic wave shielding property.

SUMMARY OF THE INVENTION

The present invention resides in an electrically conductive fabric having a metal coating wherein a percent fabric surface occupancy of warp as a constituent of the fabric is 90% to 110% and that of weft as a constituent of the fabric is 40% to 80%.

The present invention, in a preferred embodiment thereof, resides in the above electrically conductive fabric wherein the fabric is a plain weave fabric.

The present invention, in a further preferred embodiment thereof, resides in the above electrically conductive fabric wherein the fibers which constitute the fabric are synthetic filaments.

The present invention, in a still further preferred embodiment thereof, resides in the above electrically conductive fabric wherein the metal coating on the fabric is formed by an electroless plating method.

The present invention, in a still further preferred embodiment thereof, resides in the above electrically conductive fabric wherein the metal of the metal coating is at least one member selected from the group consisting of silver, copper, nickel, tin, and alloys thereof.

DETAILED DESCRIPTION OF THE INVENTION

The "percent fabric surface occupancy" as referred to herein is represented by:

Percent fabric surface occupancy of warp (%)=warp width $(A)$/warp pitch $(B)$×100

Percent fabric surface occupancy of weft (%)=warp width $(C)$/weft pitch $(D)$×100 in a fabric, as shown in FIG. 1. In the electrically conductive fabric of the present invention, the percent fabric surface occupancy of warp is 90% to 110% and that of weft is 40% to 80%.

By thus increasing the warp density of the fabric, setting the percent fabric surface occupancy of warp at 90% to 110%, allowing the fabric surface to be covered mainly with warp, further by decreasing the weft density and setting the percent fabric surface occupancy of weft at 40% to 80%, it is possible to minimize pores formed in warp-weft intersecting points. Besides, the degree of freedom of weft increases and hence the fabric becomes more flexible.

If the percent surface occupancy of warp is less than 90%, the pores formed in warp-weft intersecting points become large, and if exceeds 110%, not only weavability is impaired, but also the fabric flexibility is impaired; besides, degree of overlapping between adjacent warps increases, whereby the permeation of a plating solution is obstructed at the time of plating and hence it becomes difficult to plate the interior of the fabric.

If the Percent surface occupancy of weft is less than 40%, the yarn is apt to slip and it becomes difficult to effect processing, while if it exceeds 80%, the fabric becomes less flexible and the voids formed in warp-weft intersecting points become larger in size.

The fabric may be subjected to calendering for setting the percents fabric surface occupancy of the fabric constituting warp and weft at values falling under the above ranges.

By adopting the above-mentioned constitution there can be obtained an electrically conductive fabric which, in comparison with conventional fabrics, is more flexible, exhibits less back leak of resin at the time of resin coating, and possesses high electrical conductivity and electromagnetic wave shielding property.

As examples of fibers employable in the present invention, mention may be made of synthetic fibers such as nylon (e.g., nylon 6 and nylon 66), polyester (e.g., polyethylene terephthalate) and acryl (e.g., acrylonitrile), and natural fibers such as cotton and hemp, with synthetic fibers, especially nylon and polyester, being preferred in point of durability.

The yarn denier used is preferably in the range of 10 to 150 denier, more preferably 30 to 100 denier, and the filament denier is preferably in the range of 0.1 to 10 denier. If the yarn denier is smaller than 10 denier, the resulting fabric may be inferior in strength and platability, and the yarn denier exceeding 150 denier is not desirable because the fabric texture would become hard. The filament denier smaller than 0.1 denier is disadvantageous in point of cost and may result in deteriorated platability. The filament denier exceeding 10 denier is not desirable because it would result in the fabric texture becoming hard. Both a circular section yarn and a modified cross section yarn are employable.

The metal coating may be performed using a method known well in the field concerned, but an electroless plating method is preferred. As the metal for coating there is used at least one of silver, copper, nickel, tin, and an alloys thereof.

An elongation of the electrically conductive fabric is preferably less than 1.5% when a load of 1 kg per cm in test cloth width is imposed on the fabric. If the elongation is more than 1.5%, there arises a problem in point of processability, for example at the time of cutting, and it is impossible to attain a high dimensional accuracy. Further, if the fabric is attached in an elongated state to a housing of an electronic device, there is a fear of deteriorated shielding property.

EXAMPLES

The electrically conductive fabric of the present invention will be described below by way of examples, provided the invention is by no means limited thereto.

[Evaluation Method]

1. Back Leak of Resin

The degree of back leak of resin in a resin-coated electrically conductive fabric is judged visually as follows:
 ○ a small amount of resin back leak
 × a large amount of resin back leak 2. Flexibility A plated fabric is evaluated by handling as follows:
 ○ flexible
 Δ somewhat hard
 × hard 3. Elongation A fabric elongation is measured when a 1 kg load per cm in test cloth width is imposed on the fabric.
 ○ less than 1.5%
 × not less than 1.5%

4. Platability

Warp and weft of an electroless copper-plated fabric are visually measured for the state of plating.
 ○ good plating deposition in intersecting points
 × poor plating deposition in intersecting points 5. Electrical Resistivity A surface resistance value is measured in accordane with a four-point array probe measuring method (JIS-K-7194) using a resistance value measuring device (Loresta MP, a product of Mitsubishi Chemical Co.) and is represented in $\Omega/\square$.

6. Shielding Property.

A measuring cell similar to that devised by Ikoma Radio Wave Measuring Station, Kansai Electronic Industry Development Center, was prepared. Using a spectrum analyzer equipped with a tracking generator (HP8591EM, a porduct of Hewlett-Packard Co.), an electromagnetic wave of 500 MHz is emitted and is received by a receiving portion of the said measuring cell through a sample, then is subjected to measurement by the spectrum analyzer. Ther result is represented in dB.

Example 1

A plain weave fabric using a 50d-24f polyester multifilament yarn as warp and weft was subjected to scouring and then heat-set at 190° C. for 2 minutes to adjust the percent fabric surface occupancy of warp and that of weft to 95% and 72%, respectively. Thereafter, the fabric was etched in a solution comprising 50 g/L NaOH for about 10 minutes at 90° C., and then rinsed and dried. Thereafter, the etched fabric was immersed in Pd/Sn colloidal catalyst solution for about five minutes at 40° C. Thereafter, the primed fabric was then rinsed and immersed in a developer solution comprising 0.1N $HBF_4$ for a few minutes. The fabric was rinsed and then immersed in an electroless copper bath operating at 40° C., having the following composition that $CuSO_4 5H_2O$ 15 g/L, Ethylenediaminetetraacetic acid (40%) 50 cc/L, NaOH 15 g/L, and HCHO (37%) 10 cc/L, so the fabric was copper plated. Separately, toluene was added to 100 parts by weight of Toacron SA6218 (an acrylic resin manufactured by Toupe Co.) and 1.5 parts by weight of a UD crosslinking agent (an isocyanate crosslinking agent manufactured by Dainichiseika Colour & Chemicals Mfg. Co.) to adjust the viscosity of the resulting resin solution to 25,000 cPs. The resin solution was then applied to the surface of the fabric in an amount of 5 g/m² as solids content in accorcance with a knife coating method, followed by drying at 130° C. for 2 minutes. The performance of the thus-coated fabric is shown in Table 1.

Example 2

A plain weave fabric using a 50d-36f polyester multifilament yarn as warp and weft was subjected to scouring and then heat-set at 190° C. for 2 minutes to adjust the percent fabric surface occupancy of warp and that of weft to 99% and 78%, respectively. The fabric was then plated in the same manner as in Example 1. Separately, toluene was added to 100 parts by weight of Toacron SA6218 (an acrylic resin manufactured by Toupe Co.) and 1.5 parts by weight of a UD crosslinking agent (an isocyanate crosslinking agent manufactured by Dainichiseika Colour & Chemicals Mfg. Co.) to adjust the viscosity of the resulting resin solution to 25,000 cPs. The resin solution was then applied to the fabric surface in an amount of 5 g/m$^2$ as solids content by a knife coating method, followed by drying at 130° C. for 2 minutes. The performance of the thus-coated fabric is shown in Table 1.

Comparative Example 1

A plain weave fabric using a 50d-24f polyester multifilament yarn as warp and weft was subjected to scouring and then heat-set at 190° C. for 2 minutes to adjust the percent fabric surface occupancy of warp and that of weft to 72% and 85%, respectively. The fabric was then plated in the same manner as in Example 1. Separately, toluene was added to 100 parts by weight of Toacron SA6218 (an acrylic resin manufactured by Toupe Co.) and 1.5 parts by weight of a UD crosslinking agent (an isocyanate crosslinking agent manufactured by Dainichiseika Colour & Chemicals Mfg. Co.) to adjust the viscosity of the resulting resin solution to 25,000 cPs. The resin solution was then applied to the fabric surface in an amount of 5 g/m$^2$ as solids content by a knife coating method, followed by drying at 130° C. for 2 minutes. The performance of the thus-coated fabric is shown in Table 2.

Comparative Example 2

A plain weave fabric using a 50d-36f polyester multifilament yarn as warp and weft was subjected to scouring and then heat-set at 190° C. for 2 minutes to adjust the percent fabric surface occupancy of warp and that of weft to 89% and 61%, respectively. The fabric was then plated in the same manner as in Example 1. Separately, toluene was added to 100 parts by weight of Toacron SA6218 (an acrylic resin manufactured by Toupe Co.) and 1.5 parts by weight of a UD crosslinking agent (an isocyanate crosslinking agent manufactured by Dainichiseika Colour & Chemicals Mfg. Co.) to adjust the viscosity of the resulting resin solution to 25,000 cPs. The resin solution was then applied to the fabric surface in an amount of 5 g/m$^2$ as solids content by a knife coating method, followed by drying at 130° C. for 2 minutes. The performance of the thus-coated fabric is shown in Table 2.

Comparative Example 3

A plain weave fabric using a 50d-72f polyester multifilament finished yarn as warp and weft was subjected to scouring and then heat-set at 190° C. for 2 minutes to adjust the percent fabric surface occupancy of warp and that of weft to 90% and 85%, respectively. The fabric was then plated in the same manner as in Example 1. Separately, toluene was added to 100 parts by weight of Toacron SA6218 (an acrylic resin manufactured by Toupe Co.) and 1.5 parts by weight of a UD crosslinking agent (an isocyanate crosslinking agent manufactured by Dainichiseika Colour & Chemicals Mfg. Co.) to adjust the viscosity of the resulting resin solution to 25,000 cPs. The resin solution was then applied to the fabric surface in an amount of 5 g/m$^2$ as solids content by a knife coating method, followed by drying at 130° C. for 2 minutes. The performance of the thus-coated fabric is shown in Table 2.

Comparative Example 4

A plain weave fabric using a 50d-24f polyester multifilament yarn as warp and weft was subjected to scouring and then heat-set at 190° C. for 2 minutes to adjust the percent fabric surface occupancy of warp and that of weft to 90% each. The fabric was then plated in the sane manner as in Example 1. Separately, toluene was added to 100 parts by weight of Toacron SA6218 (an acrylic resin manufactured by Toupe Co.) and 1.5 parts by weight of a UD crosslinking agent (an isocyanate crosslinking agent manufactured by Dainichiseika Colour & Chemicals Mfg. Co.) to adjust the viscosity of the resulting resin solution to 25,000 cPs. The resin solution was then applied to the fabric surface in an amount of 5 g/m$^2$ as solids content, followed by drying at 130° C. for 2 minutes. The performance of the thus-coated fabric is shown in Table 2.

TABLE 1

|  | Example 1 | Example 2 |
| --- | --- | --- |
| Percent warp surface occupancy (%) | 95 | 99 |
| Percent weft surface occupancy (%) | 72 | 75 |
| Back leak of resin | ◯ | ◯ |
| Flexibility | ◯ | ◯ |
| Elongation (%) | ◯ | ◯ |
| Platability | ◯ | ◯ |
| Amount of plating (g/m$^2$) | 11 | 12 |
| Electrical resistivity (Ω/□) | 0.06 | 0.06 |
| Shielding Property (dB 500 MHz) | 80 | 80 |

TABLE 2

|  | Comparative Example 1 | Comparative Example 2 | Comparative Example 3 | Comparative Example 4 |
| --- | --- | --- | --- | --- |
| Percent warp surface occupancy (%) | 72 | 89 | 90 | 90 |
| Percent weft surface occupancy (%) | 85 | 61 | 85 | 90 |
| Back leak of resin | x | x | ◯ | ◯ |
| Flexibility | ◯ | ◯ | Δ | x |
| Elongation (%) | ◯ | x | x | ◯ |
| Platability | ◯ | x | x | x |
| Amount of plating (g/m$^2$) | 11 | 13 | 14 | 12 |
| Electrical resistivity (Ω/□) | 0.07 | 0.07 | 0.07 | 0.06 |
| Shielding Property (dB 500 MHz) | 75 | 75 | 85 | 80 |

According to the present invention, as set forth above, it is possible to provide an electrically conductive fabric with reduced back leak of resin, superior in all of flexibility, yarn fray preventing property, electrical conductivity and electromagnetic wave shielding property, and employable as an electromagnetic wave shielding material or a grounding material.

Figure 1:
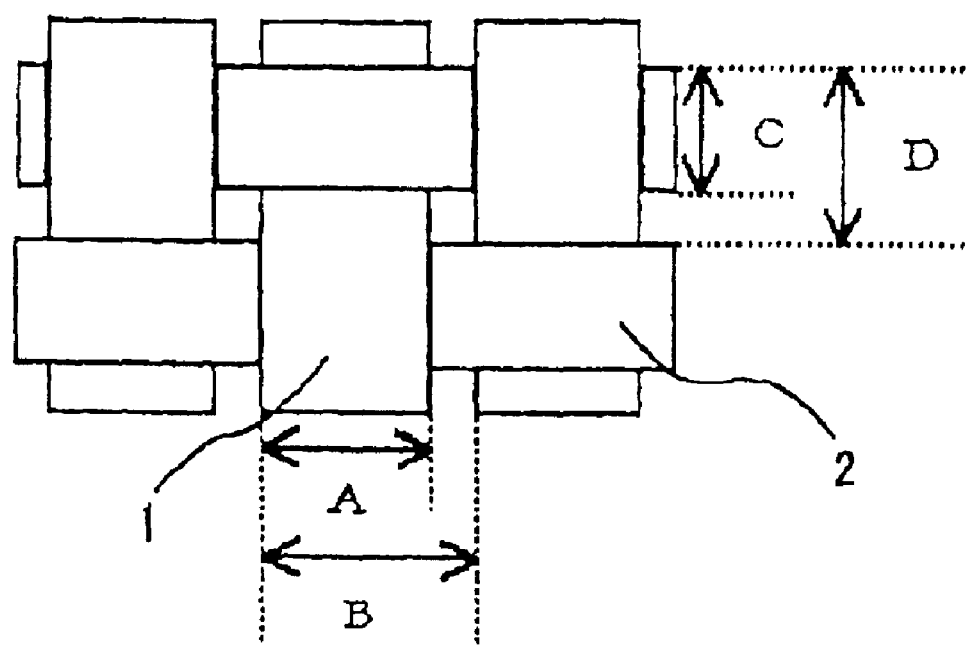
FIG. 1 is a schematic diagram showing a percent fabric surface occupancy of warp and that of weft in the electrically conductive fabric of the present invention.

In the drawing, the reference numeral 1 denotes a warp, the numeral 2 denotes a weft, the reference mark A denotes the width of the warp, the mark B denotes a warp pitch, the mark C denotes the width of the weft, and the mark D denotes a weft pitch.

What is claimed is:

1. An electrically conductive fabric having a layer of metal coating directly onto a single layer of warp and weft constituting the fabric, wherein a percent fabric surface occupancy of warp as a constituent of the fabric is 90% to 110% and that of weft as a constituent of the fabric is 40% to 80%.

2. An electrically conductive fabric according to claim 1, wherein the fabric is a plain weave fabric.

3. An electrically conductive fabric according to claim 2, wherein fibers which constitute the fabric are synthetic filaments.

4. An electrically conductive fabric according to claim 3, wherein fibers constituting the fabric are selected from at least one of nylon, polyester and acryl.

5. An electrically conductive fabric according to claim 4, wherein the nylon is at least one of nylon 6 and 66, the polyester is polyethylene terephthalate and the acryl is acrylonitrile.

6. An electrically conductive fabric according to claim 1, wherein fibers which constitute the fabric are synthetic filaments.

7. An electrically conductive fabric according to claim 1, wherein the metal coating on the fabric is formed by an electroless plating method.

8. An electrically conductive fabric according to claim 1, wherein the metal of the metal coating is at least one member selected from the group consisting of silver, copper, nickel, tin, and alloys thereof.

9. An electrically conductive fabric according to claim 1, having yarn denier in the range of 10 to 150 denier.

10. An electrically conductive fabric according to claim 9, wherein the yarn denier is in the range of 30 to 100 denier.

11. An electrically conductive fabric according to claim 1, having filament denier in the range of 0.1 to 10 denier.

12. An electrically conductive fabric according to claim 9, having filament denier in the range of 0.1 to 10 denier.

13. An electrically conductive fabric according to claim 10, having filament denier in the range of 0.1 to 10 denier.

14. An electrically conductive fabric according to claim 1, having fabric elongation of less than 1.5% when a load of 1 kg. per cm. in test cloth width is imposed on the fabric.

15. An electrically conductive fabric according to claim 1, wherein yarn constituting the fabric is synthetic multifilament yarn.

16. An electrically conductive fabric according to claim 15, having yarn denier in the range of 10 to 150 denier and filament denier in the range of 0.1 to 10 denier.

17. An electrically conductive fabric according to claim 16, wherein the multi-filament yarn is polyester.

18. An electrically conductive fabric according to claim 15, wherein the multi-filament yarn is polyester.

19. An electrically conductive fabric according to claim 1, wherein pores formed in warp-weft intersecting points are minimized, with degree of freedom of weft increasing and flexibility of the fabric improving.

20. An electrically conductive fabric according to claim 1, wherein the metallic coating is also present at intersecting points between the warps and wefts constituting the fabric.

21. An electrically conductive fabric according to claim 20, wherein the percent fabric surface occupancy of warp is defined as warp width (A)/warp pitch (B)×100, and the percent fabric surface occupancy of weft is defined as weft width (C)/weft pitch (D)×100.

22. An electrically conductive fabric according to claim 20, having a two layer structure.

23. An electrically conductive fabric according to claim 1, wherein the percent fabric surface occupancy of warp is defined as warp width (A)/warp pitch (B)×100, and the percent fabric surface occupancy of weft is defined as weft width (C)/weft pitch (D)×100.

24. An electrically conductive fabric according to claim 1, having a two layer structure.

25. An electrically conductive fabric according to claim 1 possessing conductivity in both horizontal and vertical directions, good flexibility, good resin leak prevention, good yarn fray prevention and good electromagnetic shielding.

* * * * *

UNITED STATES PATENT AND TRADEMARK OFFICE
CERTIFICATE OF CORRECTION

PATENT NO. : 6,787,488 B2  Page 1 of 1
APPLICATION NO. : 09/818289
DATED : September 7, 2004
INVENTOR(S) : Susumu Takagi et al.

It is certified that error appears in the above-identified patent and that said Letters Patent is hereby corrected as shown below:

Column 7, lines 13-15, change

"3. An electrically conductive fabric according to claim 2, wherein fibers which constitute the fabric are synthetic filaments."

to

-- 3. An electrically conductive fabric according to claim 1, wherein fibers which constitute the fabric are synthetic filaments. --

Column 7, lines 23-25, change

"6. An electrically conductive fabric according to claim 1, wherein fibers which constitute the fabric are synthetic filaments."

to

-- 6. An electrically conductive fabric according to claim 2, wherein fibers which constitute the fabric are synthetic filaments. --

Signed and Sealed this

Sixth Day of March, 2007

JON W. DUDAS
*Director of the United States Patent and Trademark Office*